(12) United States Patent
Park et al.

(10) Patent No.: US 9,412,462 B2
(45) Date of Patent: Aug. 9, 2016

(54) 3D STACKED MEMORY ARRAY AND METHOD FOR DETERMINING THRESHOLD VOLTAGES OF STRING SELECTION TRANSISTORS

(71) Applicant: Seoul National University R&DB FOUNDATION, Seoul (KR)

(72) Inventors: Byung-Gook Park, Seoul (KR); Sang-Ho Lee, Seoul (KR)

(73) Assignee: SEOUL NATIONAL UNIVERSITY R&DB FOUNDATION (KR)

( * ) Notice: Subject to any disclaimer, the term of this patent is extended or adjusted under 35 U.S.C. 154(b) by 0 days.

(21) Appl. No.: 14/798,561

(22) Filed: Jul. 14, 2015

(65) Prior Publication Data

US 2016/0019973 A1    Jan. 21, 2016

(30) Foreign Application Priority Data

Jul. 16, 2014   (KR) .................. 10-2014-0089558

(51) Int. Cl.
  *G11C 16/04*  (2006.01)
  *G11C 16/34*  (2006.01)
  *H01L 27/115*  (2006.01)

(52) U.S. Cl.
  CPC ............ *G11C 16/34* (2013.01); *G11C 16/0466* (2013.01); *G11C 16/0483* (2013.01); *H01L 27/1157* (2013.01); *H01L 27/11582* (2013.01); *G11C 2213/71* (2013.01); *H01L 27/11578* (2013.01)

(58) Field of Classification Search
  CPC ............... G11C 16/0483; G11C 16/10; G11C 11/5628; G11C 2213/71; H01L 27/11578; H01L 27/11551; H01L 27/11597
  USPC ............................ 365/185.24, 51, 63, 185.18
  See application file for complete search history.

(56) References Cited

U.S. PATENT DOCUMENTS 8,570,806 B2 *  10/2013  Lee ..................... G11C 7/18
                                                  365/185.17

FOREIGN PATENT DOCUMENTS

| KR | 10-1036155 | 5/2011 |
| KR | 10-1147526 | 5/2012 |
| KR | 10-1370509 | 3/2014 |

* cited by examiner

*Primary Examiner* — David Lam
(74) *Attorney, Agent, or Firm* — Gerald E. Hespos; Michael J. Porco; Matthew T. Hespos

(57) ABSTRACT

This invention provides 3D stacked memory arrays and methods for determining threshold voltages of string selection transistors by LSMP (layer selection by multi-level permutation) for enabling to select layers regardless of the number or as many as possible by the limited numbers of threshold voltage states and SSLs. Thus, this invention enables to maximize the degree of integrity of memory by minimizing the number of SSLs and to select layers with no limitation of the number by considering a recent aspect ratio of the semiconductor etching process.

21 Claims, 8 Drawing Sheets

|  | Vth (V) | | | |
| --- | --- | --- | --- | --- |
|  | 1st SSL | 2nd SSL | ... | nth SSL |
| 1st Layer | | | | |
| 2nd Layer | | | | |
| 3rd Layer | | | | |
| ⋮ | | | | |

| layer # | Vth (V) | |
|---|---|---|
| | 1st SSL | 2nd SSL |
| 1 | 3 | 0 |
| 2 | 2 | 1 |
| 3 | 1 | 2 |
| 4 | 0 | 3 |

| layer # | Vth (V) | |
|---|---|---|
| | 1st SSL | 2nd SSL |
| 1 | 2 | -1 |
| 2 | 1 | 0 |
| 3 | 0 | 1 |
| 4 | -1 | 2 |

FIG. 5

| number of SSLs | LASER | conventional LSM | | | | LSMP | | | |
|---|---|---|---|---|---|---|---|---|---|
| | 2 states | 3 states | 4 states | 5 states | | 2 states | 3 states | 4 states | 5 states |
| 2 | 2 | 3 | 4 | 5 | | 2 | 3 | 4 | 5 |
| 3 | 3 | - | - | - | | 3 | 7 | 12 | 19 |
| 4 | 6 | 9 | 16 | 25 | | 6 | 19 | 44 | 85 |
| 5 | 10 | - | - | - | | 10 | 51 | 155 | 381 |
| 6 | 20 | 27 | 64 | 125 | | 20 | 141 | 580 | 1751 |

*Note: table header "maximum number of selectable layers" spans LASER, conventional LSM, and LSMP columns.*

FIG. 6

$(V_0+V_1+V_2)^3$ $$= \underbrace{\frac{3!}{3!0!0!} V_0^3 V_1^0 V_2^0}_{L=0} + \underbrace{\frac{3!}{2!1!0!} V_0^2 V_1^1 V_2^0}_{L=1} + \underbrace{\frac{3!}{2!0!1!} V_0^2 V_1^0 V_2^1 + \frac{3!}{1!2!0!} V_0^1 V_1^2 V_2^0}_{L=2}$$

$$+ \underbrace{\frac{3!}{1!1!1!} V_0^1 V_1^1 V_2^1 + \frac{3!}{0!3!0!} V_0^0 V_1^3 V_2^0}_{L=3} + \underbrace{\frac{3!}{0!2!1!} V_0^0 V_1^2 V_2^1 + \frac{3!}{1!0!2!} V_0^1 V_1^0 V_2^2}_{L=4}$$

$$+ \underbrace{\frac{3!}{0!1!2!} V_0^0 V_1^1 V_2^2}_{L=5} + \underbrace{\frac{3!}{0!0!3!} V_0^0 V_1^0 V_2^3}_{L=6}$$

$$= \underbrace{V_0^3 V_1^0 V_2^0}_{L=0} + \underbrace{3V_0^2 V_1^1 V_2^0}_{L=1} + \underbrace{3V_0^2 V_1^0 V_2^1 + 3V_0^1 V_1^2 V_2^0}_{L=2}$$

$$+ \underbrace{6V_0^1 V_1^1 V_2^1 + V_0^0 V_1^3 V_2^0}_{L=3} + \underbrace{3V_0^0 V_1^2 V_2^1 + 3V_0^1 V_1^0 V_2^2}_{L=4}$$

$$+ \underbrace{3V_0^0 V_1^1 V_2^2}_{L=5} + \underbrace{V_0^0 V_1^0 V_2^3}_{L=6}$$

FIG. 7(a)

In a case of L=3

| layer # | Vth | | |
|---|---|---|---|
| | 1st SSL | 2nd SSL | 3rd SSL |
| 1 | $V_2$ | $V_1$ | $V_0$ |
| 2 | $V_2$ | $V_0$ | $V_1$ |
| 3 | $V_1$ | $V_2$ | $V_0$ |
| 4 | $V_0$ | $V_2$ | $V_1$ |
| 5 | $V_1$ | $V_0$ | $V_2$ |
| 6 | $V_0$ | $V_1$ | $V_2$ |
| 7 | $V_1$ | $V_1$ | $V_1$ |

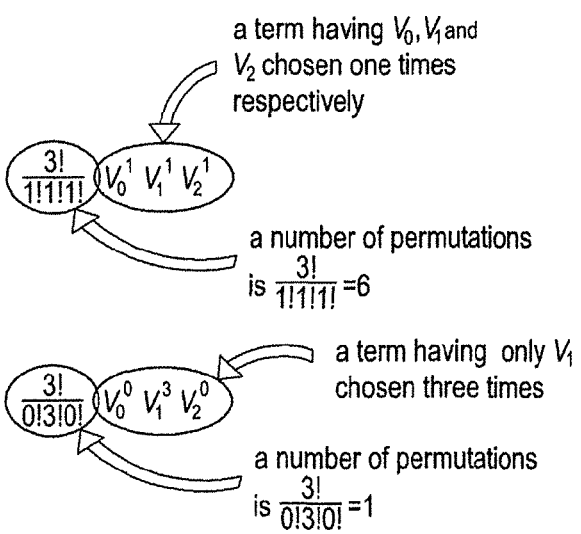

a term having $V_0$, $V_1$ and $V_2$ chosen one times respectively $\frac{3!}{1!1!1!} V_0^1 V_1^1 V_2^1$ a number of permutations is $\frac{3!}{1!1!1!}=6$ a term having only $V_1$ chosen three times $\frac{3!}{0!3!0!} V_0^0 V_1^3 V_2^0$ a number of permutations is $\frac{3!}{0!3!0!}=1$ In a case of L=2

| layer # | Vth | | |
|---|---|---|---|
| | 1st SSL | 2nd SSL | 3rd SSL |
| 1 | $V_2$ | $V_0$ | $V_0$ |
| 2 | $V_0$ | $V_2$ | $V_0$ |
| 3 | $V_0$ | $V_0$ | $V_2$ |
| 4 | $V_1$ | $V_1$ | $V_0$ |
| 5 | $V_1$ | $V_0$ | $V_1$ |
| 6 | $V_0$ | $V_1$ | $V_1$ |

$\frac{3!}{2!0!1!} V_0^2 V_1^0 V_2^1$ $\frac{3!}{1!2!0!} V_0^1 V_1^2 V_2^0$

|     | layer # | Threshold voltage (V) | | | SSL bias (V) | | |
| --- | --- | --- | --- | --- | --- | --- | --- |
|     |     | 1st SSL | 2nd SSL | 3rd SSL | 1st SSL | 2nd SSL | 3rd SSL |
| 520 | 1 | 5 | 2 | 0 | 5.5 | 2.5 | 0.5 |
|     | 2 | 5 | 0 | 2 | 5.5 | 0.5 | 2.5 |
|     | 3 | 2 | 5 | 0 | 2.5 | 5.5 | 0.5 |
|     | 4 | 0 | 5 | 2 | 0.5 | 5.5 | 2.5 |
|     | 5 | 2 | 0 | 5 | 2.5 | 0.5 | 5.5 |
|     | 6 | 0 | 2 | 5 | 0.5 | 2.5 | 5.5 |
| 511 | 7 | 5 | 1 | 1 | 5.5 | 1.5 | 1.5 |
|     | 8 | 1 | 5 | 1 | 1.5 | 5.5 | 1.5 |
|     | 9 | 1 | 1 | 5 | 1.5 | 1.5 | 5.5 |
| 430 | 10 | 4 | 3 | 0 | 4.5 | 3.5 | 0.5 |
|     | 11 | 4 | 0 | 3 | 4.5 | 0.5 | 3.5 |
|     | 12 | 3 | 4 | 0 | 3.5 | 4.5 | 0.5 |
|     | 13 | 0 | 4 | 3 | 0.5 | 4.5 | 3.5 |
|     | 14 | 3 | 0 | 4 | 3.5 | 0.5 | 4.5 |
|     | 15 | 0 | 3 | 4 | 0.5 | 3.5 | 4.5 |
| 421 | 16 | 4 | 2 | 1 | 4.5 | 2.5 | 1.5 |
|     | 17 | 4 | 1 | 2 | 4.5 | 1.5 | 2.5 |
|     | 18 | 2 | 4 | 1 | 2.5 | 4.5 | 1.5 |
|     | 19 | 1 | 4 | 2 | 1.5 | 4.5 | 2.5 |
|     | 20 | 2 | 1 | 4 | 2.5 | 1.5 | 4.5 |
|     | 21 | 1 | 2 | 4 | 1.5 | 2.5 | 4.5 |
| 331 | 22 | 3 | 3 | 1 | 3.5 | 3.5 | 1.5 |
|     | 23 | 3 | 1 | 3 | 3.5 | 1.5 | 3.5 |
|     | 24 | 1 | 3 | 3 | 1.5 | 3.5 | 3.5 |
| 322 | 25 | 3 | 2 | 2 | 3.5 | 2.5 | 2.5 |
|     | 26 | 2 | 3 | 2 | 2.5 | 3.5 | 2.5 |
|     | 27 | 2 | 2 | 3 | 2.5 | 2.5 | 3.5 |

FIG. 8B

|     | layer # | Threshold voltage (V) | | | SSL bias (V) | | |
| --- | --- | --- | --- | --- | --- | --- | --- |
|     |     | 1st SSL | 2nd SSL | 3rd SSL | 1st SSL | 2nd SSL | 3rd SSL |
| 530 | 1 | 5 | 3 | 0 | 5.5 | 3.5 | 0.5 |
|     | 2 | 5 | 0 | 3 | 5.5 | 0.5 | 3.5 |
|     | 3 | 3 | 5 | 0 | 3.5 | 5.5 | 0.5 |
|     | 4 | 0 | 5 | 3 | 0.5 | 5.5 | 3.5 |
|     | 5 | 3 | 0 | 5 | 3.5 | 0.5 | 5.5 |
|     | 6 | 0 | 3 | 5 | 0.5 | 3.5 | 5.5 |
| 521 | 7 | 5 | 2 | 1 | 5.5 | 2.5 | 1.5 |
|     | 8 | 5 | 1 | 2 | 5.5 | 1.5 | 2.5 |
|     | 9 | 2 | 5 | 1 | 2.5 | 5.5 | 1.5 |
|     | 10 | 1 | 5 | 2 | 1.5 | 5.5 | 2.5 |
|     | 11 | 2 | 1 | 5 | 2.5 | 1.5 | 5.5 |
|     | 12 | 1 | 2 | 5 | 1.5 | 2.5 | 5.5 |
| 440 | 13 | 4 | 4 | 0 | 4.5 | 4.5 | 0.5 |
|     | 14 | 4 | 0 | 4 | 4.5 | 0.5 | 4.5 |
|     | 15 | 0 | 4 | 4 | 0.5 | 4.5 | 4.5 |
| 431 | 16 | 4 | 3 | 1 | 4.5 | 3.5 | 1.5 |
|     | 17 | 4 | 1 | 3 | 4.5 | 1.5 | 3.5 |
|     | 18 | 3 | 4 | 1 | 3.5 | 4.5 | 1.5 |
|     | 19 | 1 | 4 | 3 | 1.5 | 4.5 | 3.5 |
|     | 20 | 3 | 1 | 4 | 3.5 | 1.5 | 4.5 |
|     | 21 | 1 | 3 | 4 | 1.5 | 3.5 | 4.5 |
| 422 | 22 | 4 | 2 | 2 | 4.5 | 2.5 | 2.5 |
|     | 23 | 2 | 4 | 2 | 2.5 | 4.5 | 2.5 |
|     | 24 | 2 | 2 | 4 | 2.5 | 2.5 | 4.5 |
| 332 | 25 | 3 | 3 | 2 | 3.5 | 3.5 | 2.5 |
|     | 26 | 3 | 2 | 3 | 3.5 | 2.5 | 3.5 |
|     | 27 | 2 | 3 | 3 | 2.5 | 3.5 | 3.5 | ns # 3D STACKED MEMORY ARRAY AND METHOD FOR DETERMINING THRESHOLD VOLTAGES OF STRING SELECTION TRANSISTORS

CROSS REFERENCE TO RELATED APPLICATION

This application claims priority to Korean Patent Application No. 10-2014-0089558, filed on Jul. 16, 2014, under 35 U.S.C. 119, the entire contents of which are hereby incorporated by reference.

BACKGROUND

1. Field of the Invention

The present invention relates to a three-dimensional (3D) stacked memory array, and more particularly to a 3D stacked memory array enabling to select layers as a general method or to improve the degree of integrity of a memory by selecting layers as many as possible under the limited number of threshold voltage states of string selection transistors and the limited number of string selection lines (SSLs), and to a method for determining threshold voltages of string selection transistors of the same array.

2. Description of the Related Art

Recently, there has been difficulty in improving the degree of integrity under 20 nm due to limitation of the photolithography technology. So, various memory arrays enabling a 3D stack have been studied.

When the memory structure having a 3D stacked shape is compared with the conventional two-dimensional (2D) planar structure, the greatest difference is a necessity of a layer selection in the 3D stacked memory structure during operation.

These days, the various 3D structures enabling a layer selection in the operation of writing (a program) and reading (a read) are being studied. One example is a 3D NAND flash memory array performing a layer selection by electrical erases described in Korean Patent No. 10-1147526.

The prior art is known as a structure performing a layer selection by erase operation (LASER). According to this structure, each SSL (LSL shown in FIG. 1 of Korean Patent No. 10-1147526 is equal to SSL) and a body of an active line separately formed by each layer are used to extract electrons from a specific charge storage layer between the SSL and the body of the active line in each layer for electrically forming an erase state combination, namely an initialized state combination, instead of the impurity-doped layer combination physically formed in the conventional Korean Patent No. 10-1036155. So, it has merits that the layer selection can be more easily performed.

However, because the LASER structure is consisted of sting selection transistors formed at locations crossed between each SSL and an active line (each layer of bit lines) and simply divided into initialized transistors and not, there have been some limitations in improving the degree of integrity by minimizing the number of SSLs for a layer selection.

When n is the number of SSLs and r is the number of initialized string selection transistors formed in each active line, the number of vertically stacked layers to be selected is equal to a combination expressed as nCr. To obtain the maximum value of nCr, r has to be the closest natural number to the middle value of n.

To overcome the limitations of the LASER structure, a method of a layer selection by multi-level operation (LSM) has been suggested in Korean Patent No. 10-1370509. In the LSM method, because the threshold voltages of string selection transistors in adjacent string selection lines are reversely distributed from each other, when the number of threshold voltage states is 4, it is possible that total $2^n$ layer selections can be selected by n as the number of SSLs (if n is an even number and k is the number of threshold voltage states, $k^{(n/2)}$ layers can be selected).

Because the LSM method distributes the threshold voltages of the string selection transistors in a couple of string selection lines, the more the number of SSLs is increased, the more the number of selectable layers is increased. However, if n is an odd number, there has been a problem that one of SSLs is not paired.

By looking for a method for more efficiently selecting layers as many as possible under the limited numbers of threshold voltage states and SSLs than the method for reversely distributing the threshold voltages in a pair of two SSLs, the inventors have finally contrived the present invention.

SUMMARY OF THE INVENTION

The present invention is directed to propose a general threshold voltage determination method for a layer selection which is applicable to every array structures embodied into a multi-level memory vertically stacked with a plurality of semiconductor layers such as NAND flesh, RRAM, etc. The present invention is to provide a 3D stacked memory array enabling to select layers regardless of the number or as many as possible under the limited number of threshold voltage states and the limited number of SSLs, and a method for determining threshold voltages of string selection transistors of the same array according to LSMP (layer selection by multi-level permutation).

To archive the objectives, a 3D stacked memory array according to the present invention is comprising: a plurality of active lines formed at regular intervals in a first horizontal direction with a plurality of semiconductor layers vertically stacked having insulating films between upper and lower layers on a substrate; a plurality of word lines formed at regular intervals in a second horizontal direction to be vertically aligned to each of the active lines and to pass by the plurality of semiconductor layers with insulating layers including a charge storage layer between each of the word lines and the semiconductor layers; and a plurality of string selection lines formed at regular intervals in the second horizontal direction to be parallel to each of the word lines on one side of the plurality of word lines and to pass by the plurality of semiconductor layers with insulating layers including a charge storage layer between each of the string selection lines and the semiconductor layers, wherein each of the string selection lines forms a plurality of string selection transistors vertically stacked passing by the plurality of the semiconductor layers, and wherein the plurality of string selection transistors vertically stacked have a sum of threshold voltages or threshold voltage state numbers distributed along each of the semiconductor layers in the second horizontal direction to be equal between the layers by programming the charge storage layer of each of the string selection transistors.

When a number of the plurality of string selection lines is n and a number of threshold voltage states to be distributed to the plurality of string selection transistors in a vertical direction is k, the sum of the threshold voltages distributed along each of the semiconductor layers may be a maximum integer not greater than $(n/2) \times (k-1)$ or the maximum integer plus 1.

Here, the sum of threshold voltages may be gained after the threshold voltages distributed along each of the semiconductor layers are regularly shifted into a threshold voltage window acceptable by the plurality of string selection transistors.

When a number of the plurality of string selection lines is n, a number of threshold voltage states to be distributed to the plurality of string selection transistors is k, the threshold voltage states are $V_0, V_1, V_2, V_3, \ldots,$ and $V_{k-1}$ (here, $V_0<V_1<V_2<V_3<\ldots<V_{k-1}$), and the threshold voltage state numbers are $0, 1, 2, \ldots,$ and $k-1$, the sum of the threshold voltages state numbers distributed along each of the semiconductor layers may be a maximum integer not greater than $(n/2)\times(k-1)$ or the maximum integer plus 1.

Here, the threshold voltage states distributed along each of the semiconductor layers may be substituted by threshold voltages in a threshold voltage window acceptable by the plurality of string selection transistors.

And the 3D stacked memory array according to the present invention may further comprise a ground selection line formed at a regular interval in the second horizontal direction to be parallel to each of word lines on the other side of the plurality of word lines and to pass by the plurality of semiconductor layers with insulating layers between the ground selection line and the semiconductor layers.

Here, each of the active lines may be electrically connected to each bit line on one end of the plurality of semiconductor layers adjacent to the string selection lines and the one end may be electrically connected between the upper and lower layers vertically. Another end of the plurality of semiconductor layers may be electrically connected in the same layer horizontally by the ground selection line and have a wall-shaped contact part of a common source line having one end of a stair shape to contact each of the semiconductor layers. And a body may be vertically formed to connect all upper and lower layers of the plurality of semiconductor layers adjacent to the ground selection line.

On the other hand, a method for determining threshold voltages of string selection transistors for a layer selection in a 3D stacked memory array according to the present invention is as follows:

First, the 3D stacked memory array comprises a plurality of active lines formed at regular intervals in a first horizontal direction with a vertically stacked plurality of semiconductor layers having insulating films between upper and lower layers on a substrate; a plurality of word lines formed at regular intervals in second horizontal direction to be vertically aligned to each of the active lines and to pass by the plurality of semiconductor layers with insulating layers including a charge storage layer between each of the word lines and the semiconductor layers; a plurality of string selection lines formed at regular intervals in second horizontal direction to be parallel to each of the word lines on one side of the plurality of word lines and to pass by the plurality of semiconductor layers with insulating layers including a charge storage layer between each of the string selection lines and the semiconductor layers; and a plurality of string selection transistors vertically stacked along each of the string selection lines passing by the plurality of the semiconductor layers.

Then the method for determining threshold voltages of string selection transistors for a layer selection in the 3D stacked memory array may comprise the steps of: when a number of the plurality of string selection lines is n and a number of threshold voltage states to be distributed to the plurality of string selection transistors in a vertical direction is k, setting the threshold voltage states as $V_0, V_1, V_2, V_3, \ldots,$ and $V_{k-1}$ (here, $V_0<V_1<V_2<V_3<\ldots<V_{k-1}$); expanding $(V_0+V_1+V_2+V_3+\ldots+V_{k-1})^n$ as a polynomial expansion; grouping by terms satisfying $(0\times m_0)+(1\times m_1)+(2\times m_2)+\ldots+\{(k-1)\times m_{k-1}\}=L$ from $$\frac{n!}{m_0!m_1!m_2!\ldots m_{k-1}!}V_0^{m_0}V_1^{m_1}V_2^{m_2}\ldots V_{k-1}^{m_{k-1}}$$

$$(m_0+m_1+m_2+\ldots+m_{k-1}=n)$$

(here, $m_x$ indicates how many times a threshold voltage state $V_x$ is included); and determining the threshold voltage of each of the string selection transistors by distributing threshold voltage states that compose each of terms of a group grouped by the L value to the number n in the second horizontal direction along each of the semiconductor layers.

Another method for determining threshold voltages of string selection transistors for a layer selection in the 3D stacked memory array may comprise the steps of: when a number of the plurality of string selection lines is n and a number of threshold voltage states to be distributed to the plurality of string selection transistors in a vertical direction is k, setting the threshold voltage states as $0, 1, 2, 3, \ldots,$ and $k-1$; defining an L value as a maximum integer not greater than $(n/2)\times(k-1)$ or the maximum integer plus 1; counting a number of cases that the sum of n threshold voltage states chosen from the threshold voltage states with repetition is equal to the L value; and determining the threshold voltage of each of the string selection transistors by distributing the n threshold voltage states along each of the semiconductor layers, the number of cases being a number of layers which can select the plurality of semiconductor layers.

Another method for determining threshold voltages of string selection transistors for a layer selection in the 3D stacked memory array may comprise the steps of: when a number of the plurality of string selection lines is n and a number of threshold voltage states to be distributed to the plurality of string selection transistors in a vertical direction is k, setting the threshold voltage states as $V_0, V_1, V_2, V_3, \ldots,$ and $V_{k-1}$ (here, $V_0<V_1<V_2<V_3<\ldots<V_{k-1}$); getting the threshold voltage state numbers as $0, 1, 2, \ldots,$ and $k-1$; defining an L value as a maximum integer not greater than $(n/2)\times(k-1)$ or the maximum integer plus 1; making multisets having n elements chosen from the threshold voltage state numbers with repetition, a sum of the n elements being equal the L value; calculating permutations of the multisets; replacing threshold voltage state numbers as the n elements of each of the permutations with corresponding n threshold voltage states among $V_0, V_1, V_2, V_3, \ldots,$ and $V_{k-1}$ (here, $V_0<V_1<V_2<V_3<\ldots<V_{k-1}$); and determining the threshold voltage of each of the string selection transistors by distributing the n threshold voltage states along each of the semiconductor layers by the permutations, a number of the permutations being a number of layers which can select the plurality of semiconductor layers.

Here, the threshold voltage states may be adjusted within a threshold voltage window acceptable by the plurality of string selection transistors.

The present invention provides 3D stacked memory arrays and methods for determining threshold voltages of string selection transistors by LSMP for enabling to select layers regardless of the number or as many as possible by the limited numbers of threshold voltage states and SSLs. Thus, the present invention enables to maximize the degree of integrity of memory by minimizing the number of SSLs and to select layers with no limitation of the number by considering a recent aspect ratio of the semiconductor etching process.

BRIEF DESCRIPTION OF THE DRAWINGS

FIG. 5 is a comparison table showing the number of layers which can be selected by LSMP method of the present invention and LASER and LSM methods of the prior art under the same given conditions.

FIG. 6 is a polynomial expansion diagram showing grouping a group by terms having a predetermined L value when a number of string selection lines (SSLs) n=3 and a number of threshold voltage states k=3 according to an embodiment of the present invention.

FIGS. 7A and 7B are threshold voltage determination exemplary diagrams showing processes to fill out a threshold voltage distribution table of string selection transistors of FIG. 2B. The table is filled out by distributing threshold voltage states which compose each term of a group grouped by a predetermined L value to string selection lines along each of semiconductor layers as many as a number of permutations of each term.

FIGS. 8A and 8B are threshold voltage determination exemplary diagrams (each left side) and SSL bias schemes (each right side) according to an embodiment of the present invention. As shown in FIGS. 8A and 8B, when a number of string selection lines (SSLs) n is an odd number (for example, n=3) and a number of threshold voltage states k is an even number (for example, k=6), it is possible to define L value as 7 or 8 according to definition of the L value as a maximum integer not greater than $(n/2) \times (k-1)$ or the maximum integer plus 1. In other words, when the L value is 7 or 8, the maximum number of selectable layers is 27 layers and both cases are equal to each other as shown in FIGS. 8A and 8B.

In these drawings, the following reference numbers are used throughout: reference number 10 indicates a semiconductor layer, 12 a stacked buffer layer, 20 an insulating film, 30 a contact plug, 40 a bit line, 50 a string selection line, 52 a charge storage layer, 60 a word line, 70 a ground selection line, 80 a wall-shaped contact part of a common source line, and 90 a body.

DETAILED DESCRIPTION OF THE PREFERRED EMBODIMENTS

Detailed descriptions of preferred embodiments of the present invention are provided below with accompanying drawings.

Figure 1A:
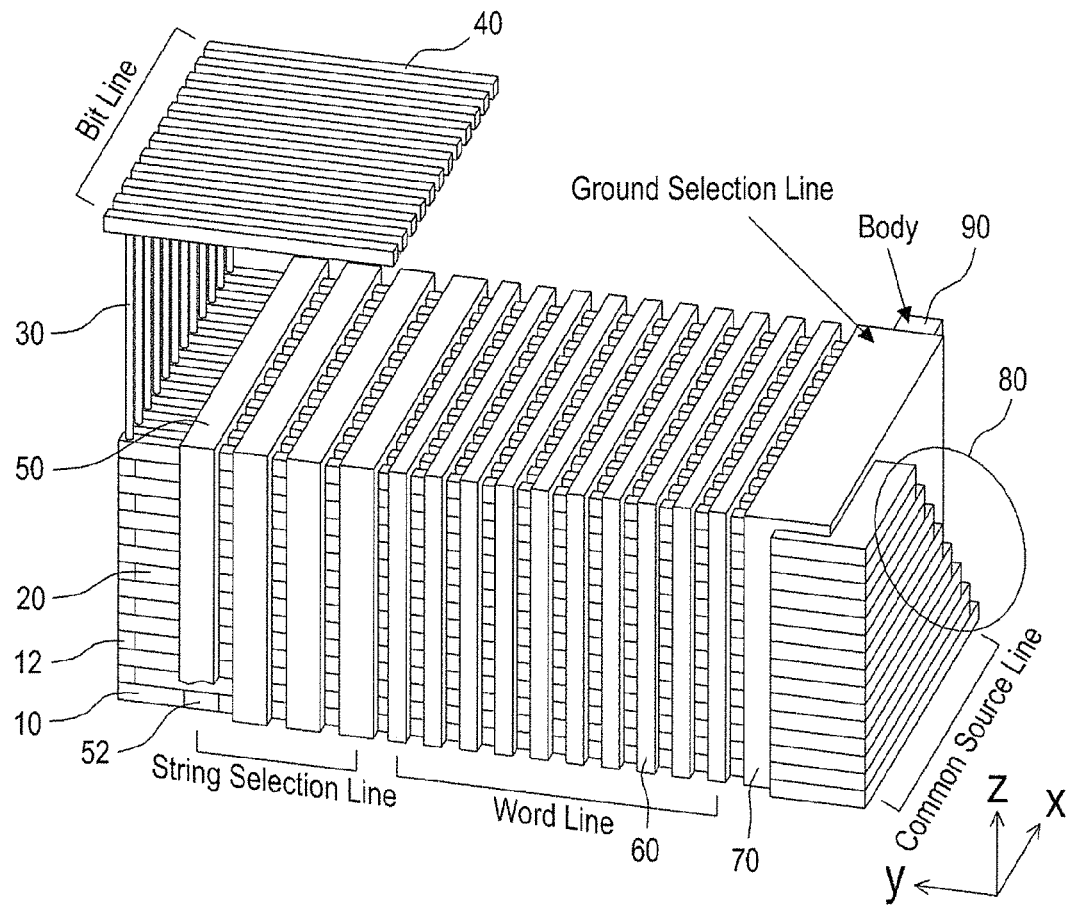
FIGS. 1A and 1B are perspective and one side views showing an unit building structure of a 3D stacked memory array according to an embodiment of the present invention, respectively and showing that the sum of threshold voltages or the sum of threshold voltage state numbers indicating states of the threshold voltages of string selection transistors is the same in each layer.
Figure 1B:
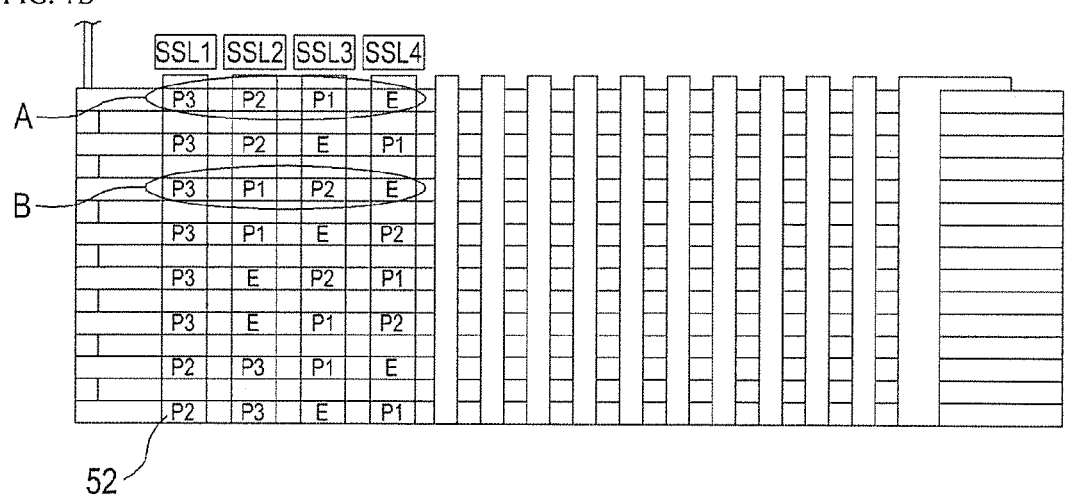
Figures 2A, 2B:
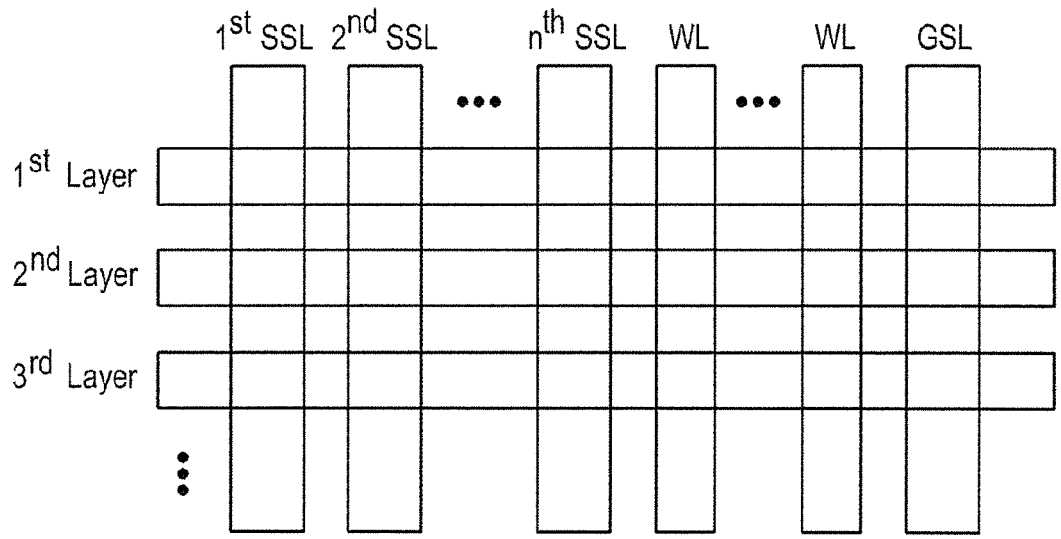
FIG. 2A is a one side view redrawn as a brief drawing of FIG. 1B
FIG. 2B is a threshold voltage distribution table of string selection transistors of FIG. 2A to be determined by the present invention.

First, a 3D stacked memory array according to an embodiment of the present invention is comprising: as drawn in FIG. 1A, a plurality of active lines (for example, lines connected to a bit line 40) formed at regular intervals in a first horizontal direction (for example, in an x-axis direction) with a plurality of semiconductor layers 10 vertically stacked having insulating films 20 between upper and lower layers on a substrate (not shown); a plurality of word lines 60 formed at regular intervals in second horizontal direction (for example, in a y-axis direction) to be vertically aligned to each of the active lines and to pass by the plurality of semiconductor layers 10 with insulating layers (not shown) including a charge storage layer between each of the word lines and the semiconductor layers; and a plurality of string selection lines 50 formed at regular intervals in second horizontal direction (for example, in a y-axis direction) to be parallel to each of the word lines on one side of the plurality of word lines 60 and to pass by the plurality of semiconductor layers 10 with insulating layers including a charge storage layer 52 between each of the string selection lines and the semiconductor layers, as shown in FIGS. 1B and 2A, wherein each of the string selection lines 50 (1st SSL, 2nd SSL, . . . , nth SSL) forms a plurality of string selection transistors vertically stacked passing by the plurality of the semiconductor layers 10 (1st layer, 2nd layer, 3rd layer, . . . ), and wherein the plurality of string selection transistors vertically stacked have a sum of threshold voltages distributed along each of the semiconductor layers 10 in the second horizontal direction (for example, in a y-axis direction) to be equal between the layers by programming the charge storage layer 52 of each of the string selection transistors. Namely, as shown in FIG. 1B, though the threshold voltages distributed along a first semiconductor layer (for example, A: a 1st layer) are P3, P2, P1 and E (an erase state), and the threshold voltages distributed along a third semiconductor layer (for example, B: a 3rd layer) are P3, P1, P2 and E, sums of threshold voltages distributed along each of the first and third semiconductor layers are the same. Here, E, P1, P2 and P3 may have a relationship sequentially increased in a predetermined size as E<P1<P2<P3.

In more detailed embodiment, when the number of the plurality of string selection lines 50 is n=3 and the number of the threshold voltage states to be distributed to the plurality of string selection transistors stacked in a vertical direction is k=6, a threshold voltage state table can be assumed as Table 1.

TABLE 1

| State | $1^{st}$ | $2^{nd}$ | $3^{rd}$ | $4^{th}$ | $5^{th}$ | $6^{th}$ |
|---|---|---|---|---|---|---|
| $V_{th}$ [V] | 0 | 1 | 2 | 3 | 4 | 5 |

When the threshold voltages assumed in Table 1 are chosen with repetition and filled in a threshold voltage distribution table as shown in FIG. 2B of string selection transistors having 3 string selection lines 50, n=3, it is possible to get a maximum number of permutations in case that a sum of the threshold voltages distributed along each of semiconductor layers 10, i.e., a sum of elements of each of the permutations, is a maximum integer not greater than $(n/2) \times (k-1)$.

In the above embodiment, the maximum integer not greater than $(n/2) \times (k-1)$ can be written in the Gauss' notation, square brackets, meaning the floor function as follows:

$$[(n/2) \times (k-1)] = [(3/2) \times (6-1)] = [7.5] = 7$$

Thus, when the threshold voltages assumed in Table 1 are chosen with repetition and distributed to three string selection lines 50, it is possible to make multisets having three elements chosen from the threshold voltages in Table 1 in condition that a sum of the three elements is 7 and to obtain total 27 permutations by calculating permutations of the multisets as below:

$$\{5, 2, 0\}: 3! = 6$$
$$\{5, 1, 1\}: {}_3C_1 = 3$$
$$\{4, 3, 0\}: 3! = 6$$
$$\{4, 2, 1\}: 3! = 6$$
$$\{3, 3, 1\}: {}_3C_2 = 3$$
$$\underline{\{3, 2, 2\}: {}_3C_1 = 3}$$
$$\text{total } 27$$

When the 27 permutations obtained above are distributed to three string selection lines 50 (1st SSL, 2nd SSL, 3rd SSL) along each of semiconductor layers 10, FIG. 2B can be filled out such as a left side table shown in FIG. 8A.

As the above embodiment, when the number of the plurality of string selection lines 50, n, is an odd number and the number of threshold voltage states to be distributed to the plurality of string selection transistors stacked in a vertical direction, k, is an even number, it is also possible to get the maximum number of permutations in case that a sum of the threshold voltages distributed along each of semiconductor layers 10, i.e., a sum of elements of each of the permutations, is the maximum integer not greater than $(n/2) \times (k-1)$ plus 1.

A left side table shown in FIG. 8B is a threshold voltage distribution table of string selection transistors and is obtained by, when n=3 and k=6, using the condition that the sum of threshold voltages distributed along each of semiconductor layers 10 is equal to the maximum integer not greater than $(n/2) \times (k-1)$ plus 1, namely 8. The result of the left side table shown in FIG. 8B shows that it is also possible to select up to 27 layers independently as like as that of the left side table shown in FIG. 8A by the 27 permutations of threshold voltage distribution.

After completing the threshold voltage distribution table of string selection transistors as each of the left side tables shown in FIGS. 8A and 8B, it is preferable that threshold voltages distributed along each of the semiconductor layers are regularly shifted into a threshold voltage window acceptable by the plurality of string selection transistors as shown in FIG. 3 and a sum of the shifted threshold voltages along each of the semiconductor layers is equal between the layers by programming a charge storage layer 52 of each of the string selection transistors.

Figures 3A, 3B, 4:
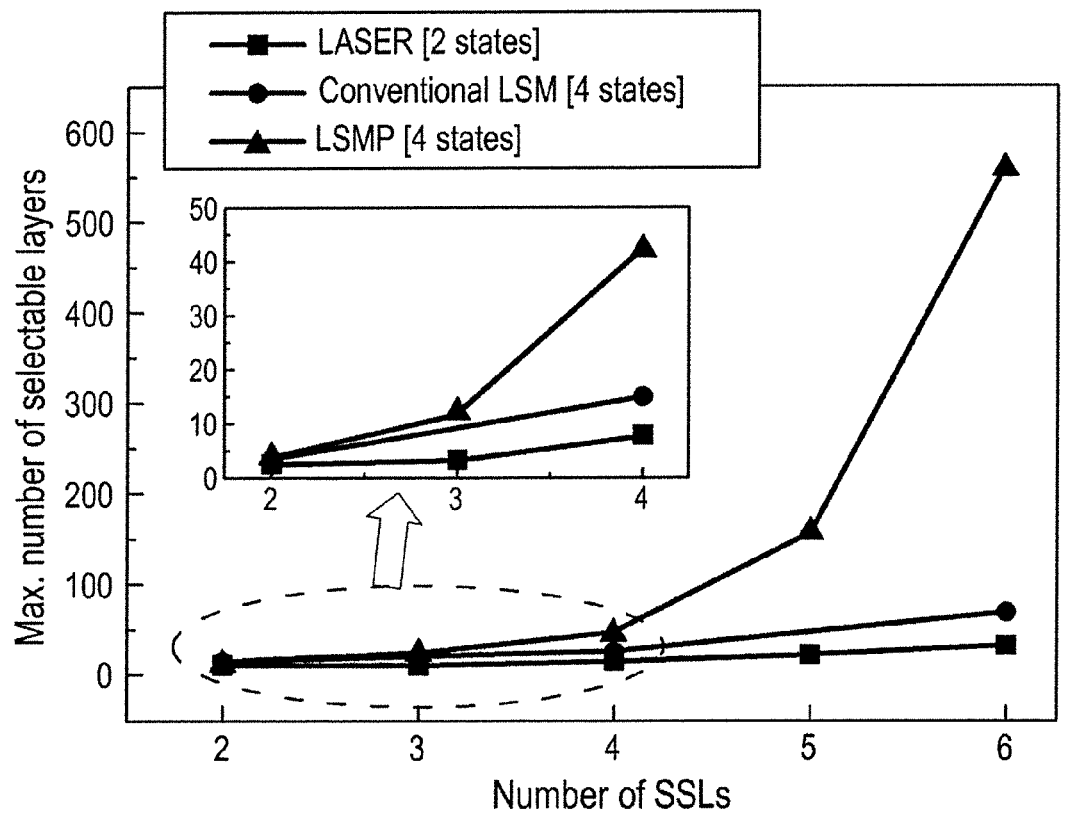
FIGS. 3A and 3B show that a threshold voltage distribution table (FIG. 3A) of string selection transistors determined by the present invention can be changed into a threshold voltage distribution table (FIG. 3B) regularly adjusted within a threshold voltage window acceptable by string selection transistors.
FIG. 4 is a comparison diagram showing the number of layers which can be selected by LSMP method of the present invention and LASER and LSM methods of the prior art, respectively.

For example, as shown in FIG. 3, after completing the threshold voltage distribution table (FIG. 3A) of string selection transistors having n=2 and k=4, if the threshold voltage window acceptable by each of string selection transistors is −1.5~2.5 V, it can be adjusted as shown in FIG. 3B by shifting all threshold voltage states shown in FIG. 3A to be reduced by −1.

The technical idea of the above mentioned embodiments is that the plurality of string selection transistors vertically stacked are formed by each of the string selection lines 50 passing by the plurality of the semiconductor layers 10 (1st layer, 2nd layer, 3rd layer, . . . ) and have a sum of threshold voltages distributed along each of the semiconductor layers to be equal between the layers by programming the charge storage layer 52 of each of the string selection transistors.

Furthermore, generalized embodiments can be obtained from the above mentioned embodiments by introducing concepts such as a threshold voltage set of the threshold voltages, i.e. the threshold voltage states, acceptable by a plurality of string selection transistors, threshold voltage states as elements of the threshold voltage set, threshold voltage state numbers separately representing each of the threshold voltage states, and a state number set having the threshold voltage state numbers as elements.

In other words, when the threshold voltage set is V and the threshold voltage states as elements of the set V are $V_0, V_1, V_2, V_3, \ldots,$ and $V_{k-1}$ (here, $V_0 < V_1 < V_2 < V_3 < \ldots < V_{k-1}$), it can be written as $V = \{V_0, V_1, V_2, V_3, \ldots, V_{k-1}\}$. Here, because the threshold voltage state numbers are $0, 1, 2, 3, \ldots,$ and $k-1$, if the state number set is M, it can be written as $M = \{0, 1, 2, 3, \ldots, k-1\}$.

In the above mentioned embodiments, the descriptions are based on the set V of the threshold voltages acceptable by the plurality of the string selection transistors. If the above descriptions are rewritten by the set M of the threshold voltage state numbers instead of the set V of the threshold voltages, other generalized embodiments can be obtained as below: the latter embodiments have merits to be also applicable to cases having irregular intervals between the threshold voltage states as elements of the set V, namely cases having irregular size differences between threshold voltages.

Hereinafter, detailed descriptions of embodiments described with the threshold voltage state numbers instead of the threshold voltages are provided following the above mentioned embodiments.

A 3D stacked memory array according to another embodiment of the present invention is comprising: as drawn in FIG. 1A, a plurality of active lines (for example, lines connected to a bit line 40) formed at regular intervals in a first horizontal direction (for example, in an x-axis direction) with a plurality of semiconductor layers 10 vertically stacked having insulating films 20 between upper and lower layers on a substrate (not shown); a plurality of word lines 60 formed at regular intervals in second horizontal direction (for example, in a y-axis direction) to be vertically aligned to each of the active lines and to pass by the plurality of semiconductor layers 10 with insulating layers (not shown) including a charge storage layer between each of the word lines and the semiconductor layers; and a plurality of string selection lines 50 formed at regular intervals in second horizontal direction (for example, in a y-axis direction) to be parallel to each of the word lines on one side of the plurality of word lines 60 and to pass by the plurality of semiconductor layers 10 with insulating layers including a charge storage layer 52 between each of the string selection lines and the semiconductor layers, as shown in FIGS. 1B and 2A, wherein each of the string selection lines 50 (1st SSL, 2nd SSL, . . . , nth SSL) forms a plurality of string selection transistors vertically stacked passing by the plurality of the semiconductor layers 10 (1st layer, 2nd layer, 3rd layer, . . . ), and wherein the plurality of string selection transistors vertically stacked have a sum of threshold voltage state numbers distributed along each of the semiconductor layers 10 in the second horizontal direction (for example, in a y-axis direction) to be equal between the layers by programming the charge storage layer 52 of each of the string selection transistors.

In other words, in an embodiment shown in FIG. 1B, because the plurality of the string selection transistors can have four threshold voltage states $V_0, V_1, V_2$ and $V_3$ (here, $V_0 < V_1 < V_2 < V_3$), a set V of the threshold voltage states is $V = \{V_0, V_1, V_2, V_3\}$ and a set M of the threshold voltage state numbers is $M = \{0, 1, 2, 3\}$. Here, because $E < P1 < P2 < P3$, the threshold voltage states are $V_0 = E, V_1 = P1, V_2 = P2$ and $V_3 = P3$. Thus, in FIG. 1B, though the threshold voltage states distributed along a first semiconductor layer (for example, A: a 1st layer) are $V_3$, $V_2$, $V_1$ and $V_0$ and the threshold voltage states distributed along a third semiconductor layer (for example, B: a 3rd layer) are $V_3$, $V_1$, $V_2$ and $V_0$, sums of threshold voltage state numbers distributed along each of the first and third semiconductor layers are the same as 0+1+2+3=6.

In more detailed embodiment, when the number of the plurality of string selection lines 50 is n=3 and the number of the threshold voltage states to be distributed to the plurality of string selection transistors is k=6, a threshold voltage state table can be assumed as Table 2.

TABLE 2

| $V_{th}$ state | $V_0$ | $V_1$ | $V_2$ | $V_3$ | $V_4$ | $V_5$ |
|---|---|---|---|---|---|---|
| $V_{th}$ state number | 0 | 1 | 2 | 3 | 4 | 5 |

Table 2 shows threshold voltage state numbers (Vth state numbers) instead of threshold voltages (Vth) in Table 1. When the threshold voltage state numbers assumed in Table 2 are chosen with repetition and filled in a threshold voltage distribution table as shown in FIG. 2B of string selection transistors having three string selection lines 50, n=3, it is possible to get a maximum number of permutations in case that a sum of the threshold voltage state numbers distributed along each of semiconductor layers 10, i.e., a sum of elements of each of the permutations, is a maximum integer not greater than (n/2)×(k−1).

In the above embodiment, the maximum integer not greater than (n/2)×(k−1) can be written in the Gauss' notation, square brackets, meaning the floor function as follows:

$$[(n/2)\times(k-1)]=[(3/2)\times(6-1)]=[7.5]=7$$

Thus, when the threshold voltage state numbers assumed in Table 2 are chosen with repetition and distributed to three string selection lines 50, it is possible to make multisets having three elements chosen from the threshold voltage state numbers in Table 2 in condition that a sum of the three elements is 7 and to obtain total 27 permutations by calculating permutations of the multisets as below:

$$\{5, 2, 0\}: 3\,! = 6$$
$$\{5, 1, 1\}: {}_3C_1 = 3$$
$$\{4, 3, 0\}: 3\,! = 6$$
$$\{4, 2, 1\}: 3\,! = 6$$
$$\{3, 3, 1\}: {}_3C_2 = 3$$
$$\underline{\{3, 2, 2\}: {}_3C_1 = 3}$$
$$\text{total } 27$$

When the 27 permutations obtained above are distributed to three string selection lines 50 (1st SSL, 2nd SSL, 3rd SSL) along each of semiconductor layers 10, threshold voltage states corresponding to the threshold voltage state numbers of each of the permutations are distributed because the elements of each permutation are the threshold voltage state numbers.

For example, from a multiset $\{3, 2, 2\}$, three permutations such as (3, 2, 2), (2, 3, 2) and (2, 2, 3) can be obtained. The three permutations are distributed to three string selection lines along each of the semiconductor layers 10. At this time, threshold voltage states corresponding to the threshold voltage state numbers of each permutation are distributed. Namely, in case of permutation (2, 2, 3), ($V_2$, $V_2$, $V_3$) are distributed. Here, if each of threshold voltage states is equal to a corresponding threshold voltage state number, this embodiment is the same as the above mentioned embodiment based on the threshold voltages. Thus, FIG. 2B can be filled out such as a left side table shown in FIG. 8A under the above condition.

As the above embodiment, when the number of the plurality of string selection lines 50, n, is an odd number and the number of threshold voltage states to be distributed to the plurality of string selection transistors, k, is an even number, it is also possible to get the maximum number of permutations in case that a sum of the threshold voltage state numbers distributed along each of semiconductor layers 10, i.e., a sum of elements of each of the permutations, is the maximum integer not greater than (n/2)×(k−1) plus 1.

A left side table shown in FIG. 8B may be a threshold voltage distribution table of string selection transistors and be obtained by, when n=3 and k=6, using the condition that the sum of the threshold voltage state numbers distributed along each of semiconductor layers 10 is equal to the maximum integer not greater than (n/2)×(k−1) plus 1, namely 8. The result of the left side table shown in FIG. 8B shows that it is also possible to select up to 27 layers independently as like as that of the left side table shown in FIG. 8A by the 27 permutations of state number distribution.

The examples shown in FIGS. 8A and 8B, as mentioned above, show the cases that the threshold voltage states distributed to each of the string selection lines of each of the semiconductor layers 10 are equal to the corresponding threshold voltage state numbers, respectively. As a general rule, after calculating the permutations from each of multisets, when the threshold voltage states corresponding to the threshold voltage state numbers of each permutation are distributed, it is preferable that the threshold voltage states are replaced with the threshold voltages adjusted within a threshold voltage window acceptable by the plurality of string selection transistors.

For example, as shown in FIG. 3, after completing the threshold voltage distribution table (FIG. 3A) of string selection transistors having n=2 and k=4, if the threshold voltage states distributed along the second string selection line (2nd SSL) are $V_0=0V$, $V_1=1V$, $V_2=2V$ and $V_3=3V$ and the threshold voltage window acceptable by each of string selection transistors is −1.5~2.5V, it can be adjusted as shown in FIG. 3B by shifting all threshold voltage states shown in FIG. 3A to be reduced by −1.

FIG. 4 is a comparison diagram showing the number of layers which can be selected by LSMP method of the present invention and LASER and LSM methods of the prior art, respectively. And FIG. 5 is a comparison table showing the number of layers which can be selected by LSMP method of the present invention and LASER and LSM methods of the prior art under the same given conditions.

FIGS. 4 and 5 show that the conventional LASER method requires the most number of SSLs to select the same number of layers because of having only two threshold voltage states and that the conventional LMS method has a limitation for the number of selectable SSLs by using a method for pairing every two SSLs and still needs a large number of SSLs even though the number of threshold voltage states is 4. Especially, for the conventional LMS method, in order to select more layers under a given number of SSLs, it needs to increase the number of threshold voltage states. Because of the limited memory window, a threshold voltage window acceptable by string selection transistors must be divided into more narrow areas. This causes a problem of weakness in deterioration of threshold voltages.

However, if the LSMP method according to the present invention is used, it is possible to select 580 layers only with four threshold voltage states and six SSLs. And by considering an aspect ratio of a recent semiconductor etching process, it can be seen that there is no restriction on the layer selection in the 3D stacked memory array. And, as confirmed in FIG. 5, when the number of threshold voltage states is 2 in the LSMP method according to the present invention, it is equal to the conventional LASER method and when the number of SSLs is 2, it is equal to the conventional LSM method. Thus, the conventional LASER and LSM methods may be special cases of the present invention.

Next, detailed descriptions of the other components of the 3D stacked memory array are more provided.

A gate insulator of each of the string selection transistors can be formed with insulating layers including a charge storage layer 52, for example, ONO layers (Oxide/Nitride/Oxide layers) as in a memory cell device formed by each word line 60. If it is formed with ONO layers, the charge storage layer 52 is a Nitride layer.

The threshold voltages of the threshold voltage distribution tables of string selection transistors according to each of the embodiments such as each of left side tables shown in FIGS. 8A and 8B or the threshold voltages adjusted into the threshold voltage window of string selection transistors as shown in FIG. 3 may be formed by programming such as injection of electrons into the charge storage layer 52. And when the string selection transistors are programmed with the threshold voltages according to each of the embodiments, a SSL bias of a string selection line for each layer selection may be such as each of right side tables shown in FIGS. 8A and 8B where SSL bias schemes are provided by the value between jth and (j+1)th threshold voltage states in the left side threshold voltage distribution tables for turning-on the string selection transistors programmed with the jth threshold voltage state or lower states and for turning-off the string selection transistor programmed with the (j+1)th threshold voltage state or higher states among the vertically stacked string selection transistors in each string selection line.

And as shown in FIG. 1A, the 3D stacked memory array may further comprise a ground selection line 70 (GSL) formed at a regular interval in the second horizontal direction (for example, in a y-axis direction) to be parallel to each of word lines 60 on the other side of the plurality of word lines 60 and to pass by the plurality of semiconductor layers 10 with insulating layers between the ground selection line and the semiconductor layers.

Each of the active lines, as shown in FIG. 1A, may be electrically connected to each bit line 40 through a contact plug 30 on one end of the plurality of semiconductor layers 10 adjacent to the string selection lines 50 and the one end may be electrically connected between the upper and lower layers vertically by a conductive material layer 12. Another end of the plurality of semiconductor layers 10 may be electrically connected in the same layer horizontally by the ground selection line 70 and have a wall-shaped contact part 90 of a common source line having one end of a stair shape to contact each of the semiconductor layers 10. And a body 90 may be further vertically formed to connect all upper and lower layers of the plurality of semiconductor layers 10 adjacent to the ground selection line 70.

And the ground selection line 70 forms a plurality of ground selection transistors passing by the plurality of semiconductor layers 10 with insulating layers including a charge storage layer between the ground selection line and the semiconductor layers in the same way as the plurality of string selection lines 50 and word lines 60.

Next, embodiments of methods for determining threshold voltages of string selection transistors for a layer selection in the 3D stacked memory array according to the above embodiments are described.

First, by a general method, as shown in FIG. 1A, an embodiment of a method for determining each threshold voltage of string selection transistors for each semiconductor layer 10 selection in the 3D stacked memory arrays is described.

When a number of the plurality of string selection lines 50 is n and a number of threshold voltage states to be distributed to the plurality of string selection transistors stacked in a vertical direction is k, as a first step, the threshold voltage states may be set as $V_0$, $V_1$, $V_2$, $V_3$, ..., and $V_{k-1}$ (here, $V_0 < V_1 < V_2 < V_3 < ... < V_{k-1}$) and made into a threshold voltage state table as Table 3.

TABLE 3

| (a number of SSLs: n, a number of states: k) | | | | | | |
|---|---|---|---|---|---|---|
| State | $1^{st}$ | $2^{nd}$ | $3^{rd}$ | $4^{th}$ | ... $k^{th}$ | |
| $V_{th}$ | $V_0$ | $V_1$ | $V_2$ | $V_3$ | ... $V_{k-1}$ | $V_0 < V_1 < V_2 < V_3 < ... < V_{k-1}$ |

Next, $(V_0+V_1+V_2+V_3+...+V_{k-1})^n$ is expanded as a polynomial expansion.

Then, it is followed to be grouped by terms satisfying $(0 \times m_0)+(1 \times m_1)+(2 \times m_2)+...+\{(k-1) \times m_{k-1}\}=L$ from $$\frac{n!}{m_0! m_1! m_2! ... m_{k-1}!} V_0^{m_0} V_1^{m_1} V_2^{m_2} ... V_{k-1}^{m_{k-1}}$$

$$(m_0 + m_1 + m_2 + ... + m_{k-1} = n)$$

Here, $m_x$ indicates how many times a threshold voltage state $V_x$ is included. And L is an integer satisfying $0 \leq L \leq n(k-1)$.

Lastly, threshold voltages of each of the string selection transistors are determined through completing a threshold voltage distribution table of string selection transistors shown in FIG. 2B by distributing threshold voltage states that compose each of terms of a group grouped by the L value to the number n in the second horizontal direction (for example, in a y-axis direction) along each of the semiconductor layers 10.

A coefficient of each term of the polynomial expanded from $(V_0+V_1+V_2+V_3+...+V_{k-1})^n$ may give information about the number of layers to be arranged with permutations of the term. That is, the terms of the polynomial can be grouped by the L value and a sum of coefficients of the terms in a group may be the number of layers to be selected independently, i.e. to be arranged with permutations. Thus, when a group having the largest sum of coefficients of the terms is selected, the threshold voltage distribution table of the string selection transistors shown in FIG. 2B can be completed with permutations which enable to select the most layers under the given conditions of n and k.

FIG. 6 is an example of a polynomial expansion according to an embodiment of the present invention showing grouping a group by terms having a predetermined L value when a number of string selection lines (SSLs) is n=3 and a number of threshold voltage states is k=3.

According to FIG. 6, a threshold voltage distribution table of string selection transistors shown in FIG. 2B can be completed by selecting one of 7 groups having L=0~6 and by distributing the threshold voltage states of the selected group to each SSL along each semiconductor layer 10.

FIGS. 7A and 7B are threshold voltage determination exemplary diagrams showing processes to fill out a threshold voltage distribution table of string selection transistors shown in FIG. 2B. FIG. 7A shows a group having L=3 and FIG. 7B is for L=2. Here, L=3 is a group having the largest coefficient sum in the groups shown in FIG. 6. The table is filled out by distributing threshold voltage states which compose each term of a group grouped by a predetermined L value to string selection lines along each of semiconductor layers as many as a number of permutations of each term.

Next, an embodiment of a method for determining threshold voltages of string selection transistors and enabling to select the maximum number of layers without repetition under the detailed given conditions is described (a detailed embodiment of a method for determining threshold voltages of a 3D stacked memory array based on a threshold voltage set V).

In the above mentioned 3D stacked memory array, when a number of the plurality of string selection lines 50 is n and a number of threshold voltage states to be distributed to the plurality of string selection transistors stacked in a vertical direction is k, as a first step, the threshold voltage states may be set as 0, 1, 2, 3, . . . , and k−1. For example, they are set as Table 1.

Next, an L value may be defined as a maximum integer not greater than $(n/2) \times (k-1)$ or the maximum integer plus 1. And it is followed to count a number of cases that the sum of n threshold voltage states chosen from the threshold voltage states with repetition is equal to the L value.

For example, when n=3 and k=6, the maximum integer not greater than $(n/2) \times (k-1)$ is 7. All multisets having 7 of the sum of three chosen with repetition from the threshold voltage states assumed in Table 1 are made. As mentioned above, the total 27 permutations can be obtained by calculating for each multiset and summing for all the multisets as below:

$\{5, 2, 0\}: 3 != 6$ $\{5, 1, 1\}: {}_3C_1 = 3$ $\{4, 3, 0\}: 3 != 6$ $\{4, 2, 1\}: 3 != 6$ $\{3, 3, 1\}: {}_3C_2 = 3$ $\{3, 2, 2\}: {}_3C_1 = 3$ total 27

Then, the number of permutations may be a number of layers which can select the plurality of semiconductor layers and the threshold voltage of each of string selection transistors may be determined by distributing the n threshold voltage states along each of the semiconductor layers and filling out the threshold voltage distribution table of string selection transistor in FIG. 2B For example, when n=3 and k=6, in one case that the L value of a group having the maximum number of layers is 7 as the maximum integer not greater than $(n/2) \times (k-1)$, a threshold voltage determination exemplary diagram can be obtained such as the left table shown in FIG. 8A. And under the same conditions, in the other case that the L value of a group having the maximum number of layers is 8 as the maximum integer plus 1, the threshold voltage determination exemplary diagram can be obtained such as the left table shown in FIG. 8B as seen above.

Here, it is also preferable that the threshold voltage states, as shown in FIG. 3, are regularly shifted into a threshold voltage window acceptable by the plurality of string selection transistors.

Figure 9:
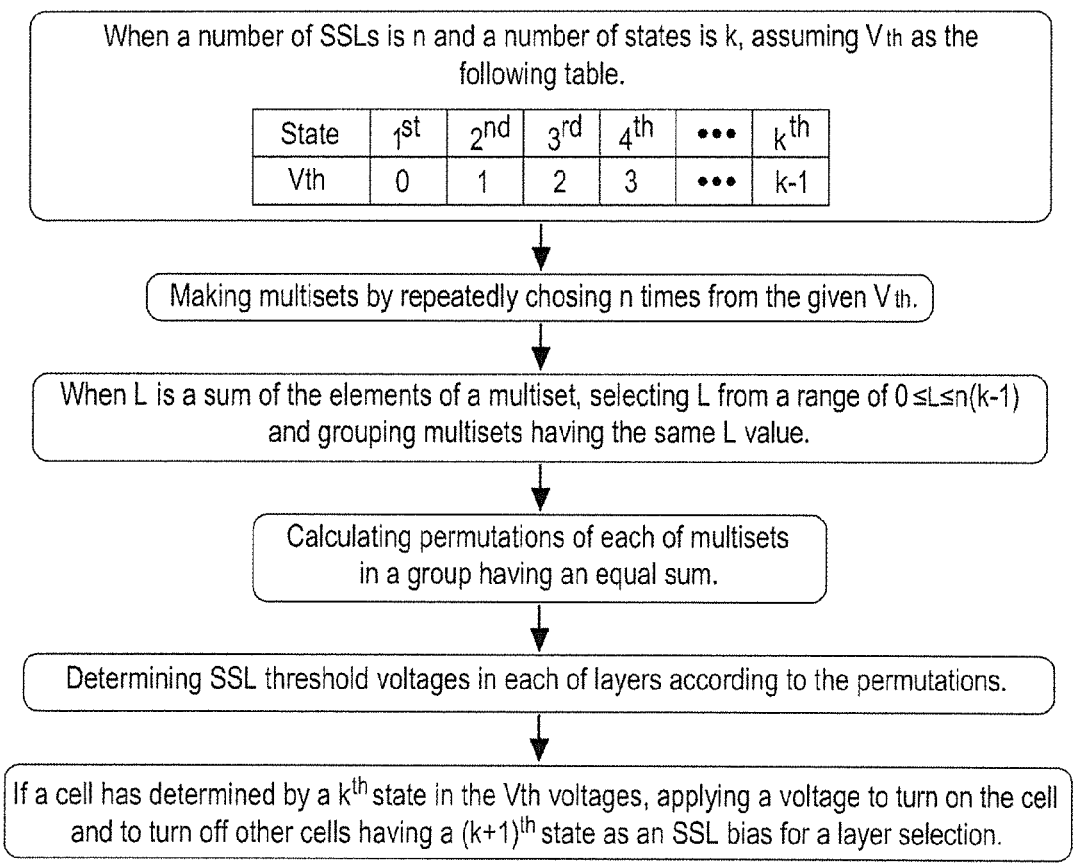
FIG. 9 is a flowchart showing a threshold voltage determination method and a SSL bias condition for a layer selection by LSMP according to an embodiment of the present invention.

FIG. 9 is a flowchart showing a threshold voltage determination method and a SSL bias condition for a layer selection by LSMP according to an embodiment of the present invention. By the flowchart, the threshold voltages of string selection transistors for a layer selection in 3D stacked memory arrays can be determined and each SSL bias condition can be obtained.

FIG. 9 and the above mentioned embodiments are the detailed embodiments of methods for determining threshold voltages of a 3D stacked memory array based on a threshold voltage set V. But in case of a 3D stacked memory array embodied on a basis of a threshold voltage state number set M instead of the threshold voltage set V, the above mentioned embodiments can be implemented as another embodiments for determining threshold voltages by modifying as below.

In the above mentioned 3D stacked memory array, when a number of the plurality of string selection lines 50 is n and a number of threshold voltage states to be distributed to the plurality of string selection transistors formed by the string selection lines is k, as a first step, the threshold voltage states may be set as $V_0, V_1, V_2, V_3, \ldots,$ and $V_{k-1}$ (here, $V_0 < V_1 < V_2 < V_3 < \ldots < V_{k-1}$) and the threshold voltage state numbers may be obtained as 0, 1, 2, 3, . . . , and k−1. For example, they are made into Table 2.

Next, an L value may be defined as a maximum integer not greater than $(n/2) \times (k-1)$ or the maximum integer plus 1. And it is followed to make multisets having n elements chosen from the threshold voltage state numbers with repetition in condition that a sum of the n elements is equal the L value.

Continuously, permutations of the multisets have a sum of the L value may be calculated and threshold voltage state numbers as the n elements of each of the permutations may be replaced with corresponding n threshold voltage states among $V_0, V_1, V_2, V_3, \ldots,$ and $V_{k-1}$ (here, $V_0 < V_1 < V_2 < V_3 < \ldots < V_{k-1}$).

For example, when n=3 and k=6, the maximum integer not greater than $(n/2) \times (k-1)$ is 7. All multisets having 7 of the sum of three chosen with repetition from the threshold voltage state numbers assumed in Table 2 are made. As mentioned above, the total 27 permutations can be obtained by calculating for each multiset and summing for all the multisets as below:

$\{5, 2, 0\}: 3 != 6$ $\{5, 1, 1\}: {}_3C_1 = 3$ $\{4, 3, 0\}: 3 != 6$ $\{4, 2, 1\}: 3 != 6$ $\{3, 3, 1\}: {}_3C_2 = 3$ $\{3, 2, 2\}: {}_3C_1 = 3$ total 27

Then, the number of the permutations may be a number of layers which can select the plurality of semiconductor layers and the threshold voltage of each of the string selection transistors may be determined by distributing the n threshold voltage states along each of the semiconductor layers by the permutations, the n threshold voltage states being respectively corresponded to threshold voltage state numbers as the n elements of each of the permutations.

For example, when n=3 and k=6, in one case that the L value of a group having the maximum number of layers is 7 as the maximum integer not greater than (n/2)×(k−1), a threshold voltage determination exemplary diagram can be obtained such as the left table shown in FIG. 8A. And under the same conditions, in the other case that the L value of a group having the maximum number of layers is 8 as the maximum integer plus 1, the threshold voltage determination exemplary diagram can be obtained such as the left table shown in FIG. 8B as seen above.

Here, it is also preferable that the threshold voltage states, as shown in FIG. 3, are regularly shifted into a threshold voltage window acceptable by the plurality of string selection transistors.

Because the above mentioned methods for determining threshold voltages of string selection transistors by LSMP of the present invention are more general threshold voltage determination methods for a layer selection, they may be applicable to any array structures embodied into multi-level memory types having a plurality of semiconductor layers stacked vertically such as NAND flesh and RRAM, etc. Therefore, this invention can be applied to various 3D stacked memory arrays.

What is claimed is:

1. A 3D stacked memory array comprising:
    a plurality of active lines formed at regular intervals in a first horizontal direction with a plurality of semiconductor layers vertically stacked having insulating films between upper and lower layers on a substrate;
    a plurality of word lines formed at regular intervals in a second horizontal direction to be vertically aligned to each of the active lines and to pass by the plurality of semiconductor layers with insulating layers including a charge storage layer between each of the word lines and the semiconductor layers; and
    a plurality of string selection lines formed at regular intervals in the second horizontal direction to be parallel to each of the word lines on one side of the plurality of word lines and to pass by the plurality of semiconductor layers with insulating layers including a charge storage layer between each of the string selection lines and the semiconductor layers,
    wherein each of the string selection lines forms a plurality of string selection transistors vertically stacked passing by the plurality of the semiconductor layers, and
    wherein the plurality of string selection transistors vertically stacked have a sum of threshold voltages or threshold voltage state numbers distributed along each of the semiconductor layers in the second horizontal direction to be equal between the layers by programming the charge storage layer of each of the string selection transistors.

2. The 3D stacked memory array of claim 1,
    wherein a number of the plurality of string selection lines is n,
    wherein a number of threshold voltage states to be distributed to the plurality of string selection transistors in a vertical direction is k, and
    wherein the sum of threshold voltages distributed along each of the semiconductor layers is a maximum integer not greater than (n/2)×(k−1) or the maximum integer plus 1.

3. The 3D stacked memory array of claim 2, wherein the sum of threshold voltages is gained after the threshold voltages distributed along each of the semiconductor layers being regularly shifted into a threshold voltage window acceptable by the plurality of string selection transistors.

4. The 3D stacked memory array of claim 3, further comprising a ground selection line formed at a regular interval in the second horizontal direction to be parallel to each of word lines on the other side of the plurality of word lines and to pass by the plurality of semiconductor layers with insulating layers between the ground selection line and the semiconductor layers.

5. The 3D stacked memory array of claim 4,
    wherein each of the active lines is electrically connected to each bit line on one end of the plurality of semiconductor layers adjacent to the string selection lines and the one end is electrically connected between the upper and lower layers vertically,
    wherein another end of the plurality of semiconductor layers is electrically connected in the same layer horizontally by the ground selection line and has a wall-shaped contact part of a common source line having one end of a stair shape to contact each of the semiconductor layers, and
    wherein a body is vertically formed to connect all upper and lower layers of the plurality of semiconductor layers adjacent to the ground selection line.

6. The 3D stacked memory array of claim 2, further comprising a ground selection line formed at a regular interval in the second horizontal direction to be parallel to each of word lines on the other side of the plurality of word lines and to pass by the plurality of semiconductor layers with insulating layers between the ground selection line and the semiconductor layers.

7. The 3D stacked memory array of claim 6,
    wherein each of the active lines is electrically connected to each bit line on one end of the plurality of semiconductor layers adjacent to the string selection lines and the one end is electrically connected between the upper and lower layers vertically,
    wherein another end of the plurality of semiconductor layers is electrically connected in the same layer horizontally by the ground selection line and has a wall-shaped contact part of a common source line having one end of a stair shape to contact each of the semiconductor layers, and
    wherein a body is vertically formed to connect all upper and lower layers of the plurality of semiconductor layers adjacent to the ground selection line.

8. The 3D stacked memory array of claim 1,
    wherein a number of the plurality of string selection lines is n,
    wherein a number of threshold voltage states to be distributed to the plurality of string selection transistors is k, the threshold voltage states are $V_0, V_1, V_2, V_3, \ldots,$ and $V_{k-1}$ (here, $V_0<V_1<V_2<V_3<\ldots<V_{k-1}$) and the threshold voltage state numbers are $0, 1, 2, \ldots,$ and $k-1$, and
    wherein the sum of the threshold voltages state numbers distributed along each of the semiconductor layers is a maximum integer not greater than (n/2)×(k−1) or the maximum integer plus 1.

9. The 3D stacked memory array of claim 8, wherein the threshold voltage states distributed along each of the semiconductor layers are substituted by threshold voltages in a threshold voltage window acceptable by the plurality of string selection transistors.

10. The 3D stacked memory array of claim 9, further comprising a ground selection line formed at a regular interval in the second horizontal direction to be parallel to each of word lines on the other side of the plurality of word lines and to pass by the plurality of semiconductor layers with insulating layers between the ground selection line and the semiconductor layers.

11. The 3D stacked memory array of claim 10,
wherein each of the active lines is electrically connected to each bit line on one end of the plurality of semiconductor layers adjacent to the string selection lines and the one end is electrically connected between the upper and lower layers vertically,
wherein another end of the plurality of semiconductor layers is electrically connected in the same layer horizontally by the ground selection line and has a wall-shaped contact part of a common source line having one end of a stair shape to contact each of the semiconductor layers, and
wherein a body is vertically formed to connect all upper and lower layers of the plurality of semiconductor layers adjacent to the ground selection line.

12. The 3D stacked memory array of claim 8, further comprising a ground selection line formed at a regular interval in the second horizontal direction to be parallel to each of word lines on the other side of the plurality of word lines and to pass by the plurality of semiconductor layers with insulating layers between the ground selection line and the semiconductor layers.

13. The 3D stacked memory array of claim 12,
wherein each of the active lines is electrically connected to each bit line on one end of the plurality of semiconductor layers adjacent to the string selection lines and the one end is electrically connected between the upper and lower layers vertically,
wherein another end of the plurality of semiconductor layers is electrically connected in the same layer horizontally by the ground selection line and has a wall-shaped contact part of a common source line having one end of a stair shape to contact each of the semiconductor layers, and
wherein a body is vertically formed to connect all upper and lower layers of the plurality of semiconductor layers adjacent to the ground selection line.

14. The 3D stacked memory array of claim 1, further comprising a ground selection line formed at a regular interval in the second horizontal direction to be parallel to each of word lines on the other side of the plurality of word lines and to pass by the plurality of semiconductor layers with insulating layers between the ground selection line and the semiconductor layers.

15. The 3D stacked memory array of claim 14,
wherein each of the active lines is electrically connected to each bit line on one end of the plurality of semiconductor layers adjacent to the string selection lines and the one end is electrically connected between the upper and lower layers vertically,
wherein another end of the plurality of semiconductor layers is electrically connected in the same layer horizontally by the ground selection line and has a wall-shaped contact part of a common source line having one end of a stair shape to contact each of the semiconductor layers, and
wherein a body is vertically formed to connect all upper and lower layers of the plurality of semiconductor layers adjacent to the ground selection line.

16. A method for determining threshold voltages of string selection transistors for a layer selection in a 3D stacked memory array, comprising:
a plurality of active lines formed at regular intervals in a first horizontal direction with a vertically stacked plurality of semiconductor layers having insulating films between upper and lower layers on a substrate;
a plurality of word lines formed at regular intervals in second horizontal direction to be vertically aligned to each of the active lines and to pass by the plurality of semiconductor layers with insulating layers including a charge storage layer between each of the word lines and the semiconductor layers;
a plurality of string selection lines formed at regular intervals in second horizontal direction to be parallel to each of the word lines on one side of the plurality of word lines and to pass by the plurality of semiconductor layers with insulating layers including a charge storage layer between each of the string selection lines and the semiconductor layers; and
a plurality of string selection transistors vertically stacked along each of the string selection lines passing by the plurality of the semiconductor layers, comprising the steps of:
when a number of the plurality of string selection lines is n and a number of threshold voltage states to be distributed to the plurality of string selection transistors in a vertical direction is k,
setting the threshold voltage states as $V_0, V_1, V_2, V_3, \ldots,$ and $V_{k-1}$ (here, $V_0<V_1<V_2<V_3<\ldots<V_{k-1}$);
expanding $(V_0+V_1+V_2+V_3+\ldots+V_{k-1})^n$ as a polynomial expansion;

$$\frac{n!}{m_0!m_1!m_2!\ldots m_{k-1}!}V_0^{m_0}V_1^{m_1}V_2^{m_2}\ldots V_{k-1}^{m_{k-1}}$$
$$(m_0+m_1+m_2+\ldots+m_{k-1}=n)$$

grouping by terms satisfying $(0\times m_0)+(1\times m_1)+(2\times m_2)+\ldots+\{(k-1)\times m_{k-1}\}=L$ from $$\frac{n!}{m_0!m_1!m_2!\ldots m_{k-1}!}V_0^{m_0}V_1^{m_1}V_2^{m_2}\ldots V_{k-1}^{m_{k-1}}$$
$$(m_0+m_1+m_2+\ldots+m_{k-1}=n)$$

(here, $m_x$ indicates how many times a threshold voltage state $V_x$ is included); and
determining the threshold voltage of each of the string selection transistors by distributing threshold voltage states that compose each of terms of a group grouped by the L value to the number n in the second horizontal direction along each of the semiconductor layers.

17. The method of claim 16, wherein the threshold voltage states are adjusted within a threshold voltage window acceptable by the plurality of string selection transistors.

18. A method for determining threshold voltages of string selection transistors for a layer selection in a 3D stacked memory array, comprising:
a plurality of active lines formed at regular intervals in a first horizontal direction with a vertically stacked plurality of semiconductor layers having insulating films between upper and lower layers on a substrate;
a plurality of word lines formed at regular intervals in second horizontal direction to be vertically aligned to each of the active lines and to pass by the plurality of semiconductor layers with insulating layers including a charge storage layer between each of the word lines and the semiconductor layers;

a plurality of string selection lines formed at regular intervals in second horizontal direction to be parallel to each of the word lines on one side of the plurality of word lines and to pass by the plurality of semiconductor layers with insulating layers including a charge storage layer between each of the string selection lines and the semiconductor layers; and a plurality of string selection transistors vertically stacked along each of the string selection lines passing by the plurality of the semiconductor layers, comprising the steps of:

when a number of the plurality of string selection lines is n and a number of threshold voltage states to be distributed to the plurality of string selection transistors in a vertical direction is k, setting the threshold voltage states as 0, 1, 2, 3, . . . , and k−1;

defining an L value as a maximum integer not greater than (n/2)×(k−1) or the maximum integer plus 1;

counting a number of cases that the sum of n threshold voltage states chosen from the threshold voltage states with repetition is equal to the L value; and determining the threshold voltage of each of the string selection transistors by distributing the n threshold voltage states along each of the semiconductor layers, the number of cases being a number of layers which can select the plurality of semiconductor layers.

19. The method of claim 18, wherein the threshold voltage states are adjusted within a threshold voltage window acceptable by the plurality of string selection transistors.

20. A method for determining threshold voltages of string selection transistors for a layer selection in a 3D stacked memory array, comprising:

a plurality of active lines formed at regular intervals in a first horizontal direction with a vertically stacked plurality of semiconductor layers having insulating films between upper and lower layers on a substrate;

a plurality of word lines formed at regular intervals in second horizontal direction to be vertically aligned to each of the active lines and to pass by the plurality of semiconductor layers with insulating layers including a charge storage layer between each of the word lines and the semiconductor layers;

a plurality of string selection lines formed at regular intervals in second horizontal direction to be parallel to each of the word lines on one side of the plurality of word lines and to pass by the plurality of semiconductor layers with insulating layers including a charge storage layer between each of the string selection lines and the semiconductor layers; and a plurality of string selection transistors vertically stacked along each of the string selection lines passing by the plurality of the semiconductor layers, comprising the steps of:

when a number of the plurality of string selection lines is n and a number of threshold voltage states to be distributed to the plurality of string selection transistors in a vertical direction is k, setting the threshold voltage states as $V_0, V_1, V_2, V_3, \ldots,$ and $V_{k-1}$ (here, $V_0 < V_1 < V_2 < V_3 < \ldots < V_{k-1}$);

getting the threshold voltage state numbers as 0, 1, 2, . . . , and k−1;

defining an L value as a maximum integer not greater than (n/2)×(k−1) or the maximum integer plus 1;

making multisets having n elements chosen from the threshold voltage state numbers with repetition, a sum of the n elements being equal the L value;

calculating permutations of the multisets;

replacing threshold voltage state numbers as the n elements of each of the permutations with corresponding n threshold voltage states among $V_0, V_1, V_2, V_3, \ldots,$ and $V_{k-1}$ (here, $V_0 < V_1 < V_2 < V_3 < \ldots < V_{k-1}$); and determining the threshold voltage of each of the string selection transistors by distributing the n threshold voltage states along each of the semiconductor layers by the permutations, a number of the permutations being a number of layers which can select the plurality of semiconductor layers.

21. The method of claim 20, wherein the threshold voltage states are adjusted within a threshold voltage window acceptable by the plurality of string selection transistors.

\* \* \* \* \*